(12) United States Patent
Karavakis et al.

(10) Patent No.: US 10,349,520 B2
(45) Date of Patent: Jul. 9, 2019

(54) MULTI-LAYER CIRCUIT BOARD USING INTERPOSER LAYER AND CONDUCTIVE PASTE

(71) Applicant: Sierra Circuits, Inc., Sunnyvale, CA (US)

(72) Inventors: Konstantine Karavakis, Pleasanton, CA (US); Kenneth S. Bahl, Saratoga, CA (US)

(73) Assignee: CATLAM, LLC, Sunnyvale, CA (US)

( * ) Notice: Subject to any disclaimer, the term of this patent is extended or adjusted under 35 U.S.C. 154(b) by 0 days.

(21) Appl. No.: 15/635,201

(22) Filed: Jun. 28, 2017

(65) Prior Publication Data
US 2019/0008044 A1 Jan. 3, 2019

(51) Int. Cl.
*H05K 1/11* (2006.01)
*H05K 1/03* (2006.01)
(Continued)

(52) U.S. Cl.
CPC .......... *H05K 1/115* (2013.01); *H05K 1/0313* (2013.01); *H05K 1/095* (2013.01); *H05K 1/111* (2013.01); *H05K 3/06* (2013.01); *H05K 3/181* (2013.01); *H05K 3/425* (2013.01); *H05K 3/4623* (2013.01); *H05K 2201/10378* (2013.01); *H05K 2203/068* (2013.01); *H05K 2203/085* (2013.01)

(58) Field of Classification Search
CPC ...... H05K 1/0313; H05K 1/115; H05K 1/095; H05K 1/111; H05K 3/06; H05K 3/181
USPC ....................................................... 174/257
See application file for complete search history.

(56) References Cited

U.S. PATENT DOCUMENTS 638,406 A 12/1899 Stone
3,014,818 A 12/1961 Wildy
(Continued)

FOREIGN PATENT DOCUMENTS

DE 3121015 C2 12/1986
EP 0472158 A3 10/1992
(Continued)

OTHER PUBLICATIONS

PCT International Preliminary Report on Patentability for PCT Application PCT/US2018/039906, dated Nov. 8, 2018.
(Continued)

*Primary Examiner* — Tremesha S Willis
(74) *Attorney, Agent, or Firm* — File-EE-Patents.com; Jay A. Chesavage

(57) ABSTRACT

A multi-layer circuit board is formed by positioning a top sub having traces on at least one side to one or more pairs of composite layers, each composite layer comprising an interposer layer and a sub layer. Each sub layer which is adjacent to an interposer layer having an interconnection aperture, the interconnection aperture positioned adjacent to interconnections having a plated through via or pad on each corresponding sub layer. Each interposer aperture is filled with a conductive paste, and the stack of top sub and one or more pairs of composite layers are placed into a lamination press, the enclosure evacuated, and an elevated temperature and laminated pressure is applied until the conductive paste has melted, connecting the adjacent interconnections, and the boards are laminated together into completed laminated multi-layer circuit board.

18 Claims, 8 Drawing Sheets

(51) Int. Cl.
    *H05K 1/09* (2006.01)
    *H05K 3/06* (2006.01)
    *H05K 3/18* (2006.01)
    *H05K 3/42* (2006.01)
    *H05K 3/46* (2006.01)

(56) References Cited

U.S. PATENT DOCUMENTS

| | | |
|---|---|---|
| 3,226,256 A | 12/1965 | Schneble et al. |
| 3,259,559 A | 7/1966 | Schneble et al. |
| 3,269,861 A | 8/1966 | Schneble et al. |
| 3,269,891 A | 8/1966 | Florus et al. |
| 3,322,881 A | 5/1967 | Schneble et al. |
| 3,370,974 A | 2/1968 | Hepfer |
| 3,546,009 A | 12/1970 | Schneble et al. |
| 3,799,802 A | 3/1974 | Schneble et al. |
| 3,925,138 A | 12/1975 | Shaul et al. |
| 4,001,466 A | 1/1977 | Shaul et al. |
| 4,145,460 A | 3/1979 | Finley et al. |
| 4,167,601 A | 9/1979 | Beckenbaugh et al. |
| 4,188,415 A | 2/1980 | Takahashi et al. |
| 4,248,921 A | 2/1981 | Steigerwald et al. |
| 4,287,253 A | 9/1981 | Leech |
| 4,354,895 A | 10/1982 | Ellis |
| 4,457,952 A | 7/1984 | Kawamoto et al. |
| 4,512,829 A | 4/1985 | Ohta et al. |
| 4,581,301 A | 4/1986 | Michaelson |
| 4,585,502 A | 4/1986 | Uozu et al. |
| 4,770,900 A | 9/1988 | Seibel |
| 4,859,571 A | 8/1989 | Cohen et al. |
| 4,908,242 A | 3/1990 | Hughes et al. |
| 4,954,185 A | 9/1990 | Kohm |
| 5,112,726 A | 5/1992 | Cohen et al. |
| 5,153,987 A | 10/1992 | Takahashi et al. |
| 5,162,144 A | 11/1992 | Brown et al. |
| 5,200,720 A | 4/1993 | Yi |
| 5,260,170 A | 11/1993 | Brown |
| 5,272,600 A | 12/1993 | Carey |
| 5,309,632 A | 5/1994 | Takahashi et al. |
| 5,340,746 A | 8/1994 | Hagen et al. |
| 5,347,712 A | 9/1994 | Yasuda et al. |
| 5,419,954 A | 5/1995 | Lane et al. |
| 5,470,532 A | 11/1995 | Hagen et al. |
| 6,452,278 B1 | 9/2002 | DiCaprio et al. |
| 6,489,720 B1 | 12/2002 | Gofuku et al. |
| 6,696,173 B1 | 2/2004 | Naundorf et al. |
| 7,067,454 B2 | 6/2006 | Raybould |
| 7,169,691 B2 | 1/2007 | Doan |
| 7,271,099 B2 | 9/2007 | Bromley et al. |
| 7,319,050 B2 | 1/2008 | Chang et al. |
| 7,334,326 B1 | 2/2008 | Huemoeller et al. |
| 7,632,753 B1 | 12/2009 | Rusli et al. |
| 7,752,752 B1 | 7/2010 | Rusli et al. |
| 7,829,990 B1 | 11/2010 | Scanlan et al. |
| 8,059,415 B2 | 11/2011 | Nelson et al. |
| 8,158,267 B2 | 4/2012 | Tacken et al. |
| 8,187,478 B2 | 5/2012 | Liu |
| 8,648,277 B2 | 2/2014 | Alpay et al. |
| 8,779,576 B2 | 7/2014 | Park et al. |
| 8,784,973 B2 | 7/2014 | Sugimura et al. |
| 8,836,144 B2 | 9/2014 | Liao |
| 8,922,014 B2 | 12/2014 | Hu et al. |
| 8,941,222 B2 | 1/2015 | Hunt |
| 9,000,558 B2 | 4/2015 | Salfaraz et al. |
| 9,000,587 B1 | 4/2015 | Kelkar et al. |
| 9,087,732 B1 | 7/2015 | Xu et al. |
| 9,117,714 B2 | 8/2015 | Weng et al. |
| 9,136,196 B2 | 9/2015 | Rathbum |
| 9,380,700 B2 | 6/2016 | Karavakis et al. |
| 2002/0079135 A1 | 6/2002 | Yazaki et al. |
| 2002/0195716 A1 | 12/2002 | Magnuson et al. |
| 2004/0134682 A1 | 7/2004 | En et al. |
| 2004/0201396 A1 | 10/2004 | Pierson et al. |
| 2004/0224252 A1 | 11/2004 | Kondo et al. |
| 2004/0226745 A1 | 11/2004 | En |
| 2005/0017369 A1 | 1/2005 | Clayton et al. |
| 2005/0218524 A1 | 10/2005 | Japp et al. |
| 2006/0055021 A1 | 3/2006 | Yamamoto |
| 2006/0057341 A1 | 3/2006 | Kawabata et al. |
| 2006/0068173 A1 | 3/2006 | Kajiyama et al. |
| 2007/0014975 A1 | 1/2007 | Ota |
| 2008/0041615 A1 | 2/2008 | Zhong et al. |
| 2009/0120660 A1 | 5/2009 | Park et al. |
| 2010/0266752 A1 | 10/2010 | Tseng et al. |
| 2011/0048783 A1 | 3/2011 | Yu |
| 2012/0074094 A1 | 3/2012 | Chiang et al. |
| 2013/0043062 A1 | 2/2013 | Wismann |
| 2015/0284856 A1 | 10/2015 | Liu et al. |
| 2015/0334825 A1 | 11/2015 | Bahl et al. |
| 2015/0334826 A1 | 11/2015 | Karavakis et al. |
| 2015/0334836 A1 | 11/2015 | Karavakis et al. |
| 2016/0135297 A1 | 5/2016 | Karavakis et al. |
| 2016/0148893 A1 | 5/2016 | Bahl et al. |
| 2017/0303396 A1* | 10/2017 | Nishioka ............... G03F 7/2004 |

FOREIGN PATENT DOCUMENTS

| | | |
|---|---|---|
| EP | 1367872 A3 | 12/2005 |
| EP | 2120525 A1 | 11/2009 |
| EP | 2420593 B1 | 4/2013 |
| EP | 2584064 A2 | 4/2013 |
| GB | 1208337 A | 10/1970 |
| WO | 2009006010 A3 | 2/2009 |
| WO | 2012127205 A1 | 9/2012 |
| WO | 2014041057 A1 | 3/2014 |

OTHER PUBLICATIONS

International Search Report and Written Opinion of the International Searching Authority for related PCT/US2015/014599 dated May 28, 2015.

International Search Report and Written Opinion of the International Searching Authority for related PCT/US2015/014615 dated May 20, 2015.

International Search Report and Written Opinion of the International Searching Authority for related PCT/US2015/014619 dated Jun. 5, 2015.

* cited by examiner

Catalytic Particle Distribution through Prepreg

Native Catalytic Pre-preg

After etch & via drill

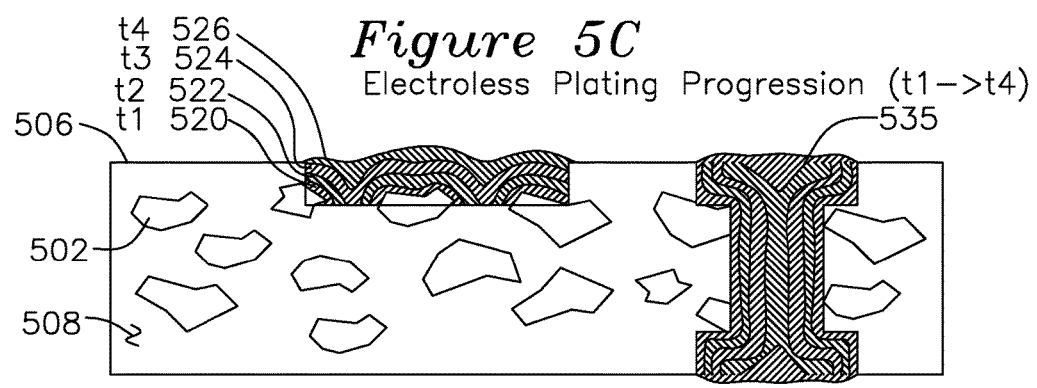
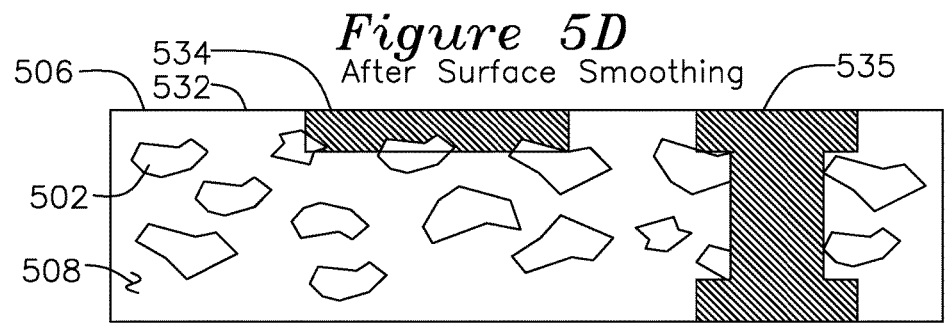

Non-catalytic layer preparation (neg a/w)

Cu Laminate drill holes & vias treat/plate vias after resist after pattern/Dev after Cu,Sn after resist strip etch Cu(Sn resist)

etch Sn

Catalytic layer preparation

Catalytic core drill vias etch trace channels electroless plate

720

Interposer/Interconnect Layer preparation

Prepreg-C
w/release film form hole solder paste

Remove release film

810

Alignment w/non-cat laminates

Alignment w/catalytic laminates

After Hi Temp Lamination multi-layer stackup before lamination after lamination

MULTI-LAYER CIRCUIT BOARD USING INTERPOSER LAYER AND CONDUCTIVE PASTE

FIELD OF THE INVENTION

The present invention relates to a multi-layer circuit board and an associated method for fabrication. In particular, the invention is related to a circuit board having multiple trace layers interconnected with an interposer layer which forms the interconnections during a single lamination step of the fabrication process.

BACKGROUND OF THE INVENTION

Prior art printed circuit boards (PCBs) are formed using conductive metal interconnects (known as "traces") formed on a dielectric substrate, where each surface carrying conductors is known as a "layer". Each dielectric substrate has traces formed on one surface or on both surfaces to form a "sub", which is one of the fundamental subassemblies of a multi-layer board, and by stacking several such dielectric cores having traces formed in them interspersed with bare dielectric layers, and laminating them together under temperature and pressure, a multi-layer printed circuit may be formed. The dielectric substrate may comprise an epoxy resin embedded in a fiber matrix such as glass fiber woven into a cloth. In one prior art fabrication method, copper is laminated onto the outer surfaces of a dielectric layer, the copper surfaces are patterned such as with a photoresist or photo sensitive film to create masked and unmasked regions, and then etched to form a conductive trace layer on one or both sides of the core dielectric. A stack of dielectric cores with conductive traces may then be laminated together to form a multi-layer PCB, and any required layer to layer interconnections made with vias, which are drilled holes plated with copper to form annular rings which provide connectivity from one trace layer to another.

One difficulty of prior art circuit board fabrication is that the addition of each new layer is a separate successive lamination step. For a four layer board (two core two-sided trace layers plus a pre-preg dielectric layer positioned in the middle), there is a single lamination step, and a 6 layer board is typically formed starting with the previously described 4 layer board after its lamination step, followed by sequentially laminating each additional two layer core to the previously laminated layers. Each lamination step requires several hours, pulling a vacuum, providing lamination pressure, and a heating and cooling cycle. In general, the number of lamination steps is equal to the number of subs less one, or for two layer subs and an n layer board (n>2) the number of lamination steps is $$\frac{n}{2} - 1.$$

After all of the lamination steps are completed, through holes are next drilled through the completed lamination at the via locations, and the via holes and any other through holes needing plating are desmeared and electroless plated through to provide electrical connectivity from one layer to another. For high speed signals, the plated through holes which transit the entire thickness of the finished pcb may result in transmission line reflections and impedance discontinuities at the through-hole structures.

Another problem of fabricating multi-layer boards is that the traces on the surfaces of each layer may tend to migrate laterally during the application of lamination heat and mechanical pressure, since the traces are typically positioned above the surface of the PCB, and they are typically exposed after etching away an original copper foil from the surface of the PCB.

It is desired to provide an alternative lamination method which provides for a single lamination step, which prevents the lateral migration of the traces during lamination, and which also provides electrical connectivity between layers such that the step of drilling through the laminate of the prior art is eliminated.

OBJECTS OF THE INVENTION

A first object of the invention is a multi-layer circuit board formed from a single lamination step of placing a top circuit trace "sub" layer comprising a C-stage pre-preg layer having circuit traces on one or more surfaces, and optionally interconnection vias or pads for connection to adjacent layers on the opposite side. One or more composite sub layers are stacked next to the top sub, each composite layer comprising an interposer and a sub, the interposer providing interconnection between the subs adjacent to each surface of the interposer, with the final sub of the composite layer being the bottom sub of the multi-layer stack. Each interposer layer has at least one aperture filled with a conductive paste, the aperture positioned to provide an electrical connection from a via of an adjacent sub layer to a via of an interposer layer positioned between the subs. Each interposer layer has at least one aperture filled with a conductive paste, the aperture positioned to provide an electrical interconnection from a via or pad of an adjacent sub layer on one side of the interposer to a via or pad of a sub on an opposite surface of the interposer, the electrical interconnections formed by laminating the multi-layer circuit board at a temperature sufficient to not only laminate the subs together, but also melt the conductive paste and electrically bridge the vias or pads of adjacent subs on either side of the interposer, thereby providing electrical connectivity and lamination during a single lamination step.

A second object of the invention is a method for manufacture of a multi-layer circuit board, the multi-layer circuit board formed from a plurality of subs having traces on one or both sides of the sub, and one or more interconnections defined by a via or pad on the sub (typically also connected to a trace on the sub), the via having a conductive inner surface, the sub layers interleaved with interposer layers providing connectivity between the corresponding sub interconnection vias or pads. The interposer layer is formed from a material suitable for lamination to the sub layers, each interposer layer having one or more apertures filled with a conductive paste, the apertures and conductive paste of the interposer positioned to provide connectivity from a sub via on one side of the interposer to a sub via on the opposite surface of the interposer. The sub layers and interposer layers are interleaved, aligned for electrical connectivity, and positioned into an enclosed lamination press, whereby the lamination press, under vacuum, elevated temperature, and applied pressure through the thickness of the laminate, causes the sub layers and interposer layers to laminate into a single structure, and also causing the interconnections to electrically bond to the conductive paste, and to consolidate the conductive paste into a conductor bridging the pads and vias.

A third object of the invention is a laminate of sub layers and interposer layers, at least one sub layer formed using a catalytic pre-preg, the catalytic pre-preg having catalytic particles which are present below a catalytic particle exclusion depth, the catalytic particles providing for electroless plating of conductive traces in the channels so formed.

SUMMARY OF THE INVENTION

In a first embodiment of the invention, a sub with at least one trace layer is formed from a dielectric having conductive traces on one side or both sides, the sub trace layer having apertures and at least one interconnection via defined by an aperture having a conductive inner surface. An interposer layer is formed from a dielectric having apertures for interconnection which correspond to the locations of sub layer interconnection vias or pads, the interposer layer apertures filled with a conductive paste. Alternating layers of the sub layers and interposer layers are stacked into a lamination press enclosure, which is evacuated to a low air pressure, and an elevated temperature is provided sufficient to melt the conductive paste while the layers are laminated together under elevated externally applied mechanical lamination pressure and chamber temperature. The conductive paste melts to provide electrical interconnection between the vias of the adjacent sub layers on either side of the interposer layer apertures, and the lamination press causes the layers to mechanically bond together into a monolithic multi-layer circuit board in a single lamination and electrical interconnection step.

In a second embodiment of the invention, a single or two-layer sub is formed from a catalytic pre-preg having a resin rich surface which excludes catalytic particles from the surface, such that the catalytic particles are distributed below the resin rich surface. Catalytic particles are not present at the surface of each catalytic laminate to below an exclusion depth, such that the surface region of the laminate has an insufficient density of catalytic particles to cause electroless plating in any region other than where a channel is formed which is deeper than the exclusion depth where the catalytic particles are available for electroless plating. In a first step, the catalytic particles are exposed by forming channels or otherwise removing the surface of the material using any removal means, including laser ablation, plasma etching, chemical etching, mechanical abrasion or cutting, or any of these techniques with or without a pattern mask. In a second step, the sub is formed by placing the catalytic laminate in an electroless plating bath, where the active metal of the electroless plating, such as exemplar Cu, is attracted to the exposed catalytic particles (such as Pt) in the patterned channel regions where the resin rich surface has been removed. The second step continues until the electroless plating fills the sides and bottom of the patterned channel with plated metal to the surrounding native surface level of the catalytic laminate. In an optional third step, the surface of the patterned trench is planarized, such as by polishing, grinding, machining, or etching, to match the level of the electroless plating to the surrounding native surface of the catalytic laminate beyond the extent of the channel. In this manner, a catalytic sub may be formed which has traces on one side or both sides, and the traces are advantageously substantially co-planar with the surface of the catalytic laminate where traces are not present.

In a third embodiment of the invention, the interposer layer is formed from a layer of dielectric such as polyimide, B-level pre-preg, epoxy or epoxy blends for flexible or non-flexible dielectrics, cyanate ester, Polytetrafluoroethylene (PTFE, known by the trade name Teflon®) or PTFE blend prepregs or adhesives, bond plies such as sequential layers of adhesive, polyimide, adhesive, or any material suitable for circuit board lamination, the dielectric layer having a release film applied to both surfaces, apertures formed in the dielectric layer and release film layers in locations which provide interconnections to adjacent subs, the apertures filled with a conductive paste, the paste optionally dried, and the release layers removed to provide a plug of dried conductive paste, the interposer layer then suitable for use in lamination and interconnection of sub layers positioned on either surface of the interposer when placed into a lamination press.

BRIEF DESCRIPTION OF THE DRAWINGS

FIG. 5C shows a section view of catalytic pre-preg during an electroless plating step during a time sequence.

FIG. 5D shows a section view of catalytic pre-preg after a surface smoothing step.

DETAILED DESCRIPTION OF THE INVENTION

Figure 1A:
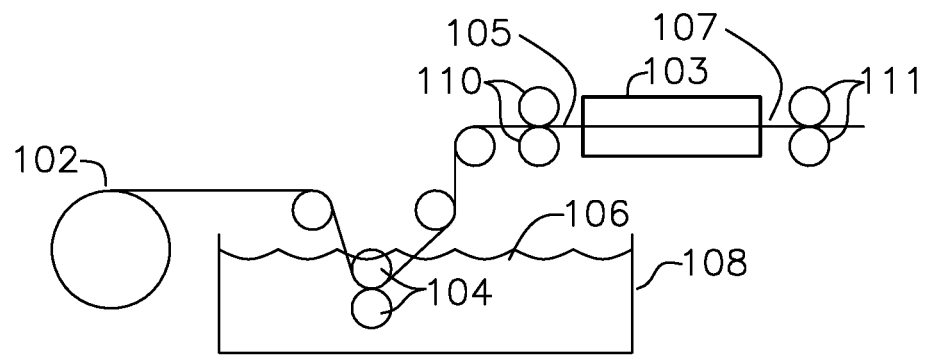
FIG. 1A shows a schematic view of a process for forming a raw catalytic pre-preg.

FIG. 1A shows an example process for fabricating pre-preg (a matrix of pre-impregnated fibers bound in resin). Many different materials may be used for the fibers of pre-preg, including woven glass-fiber cloth, carbon-fiber, or other fibers, and a variety of different materials may be used for the resin, including epoxy resin, polyimide resin, cyanate ester resin, PTFE (Teflon) blend resin, or other resins. One aspect of the invention is a printed circuit board laminate capable of supporting fine pitch conductive traces on the order of 1 mil (25 u), and while the description is drawn to the formation of copper traces using catalysts for electroless copper formation, it is understood that the scope of the invention may be extended to other metals suitable for electroless plating and electro-plating. For electroless deposition of copper (Cu) channels, elemental palladium (Pd) is preferred as the catalyst, although selected periodic table transition metal elements, such as group 9 to 11 platinum (Pt), rhodium (Rh), iridium (Ir), nickel (Ni), gold (Au), silver (Ag), cobalt (Co), or copper (Cu), or other compounds of these, including other metals such as iron (Fe), manganese (Mn), chromium (Cr), molybdenum (Mo), tungsten (W), titanium (Ti), tin (Sn), or mixtures or salts of the above, any of which may be used as catalytic particles. The present candidate list is intended to be exemplar rather than comprehensive, it is known in the art that other catalysts for attracting copper ions may also be used. In one example of the invention, the catalytic particles are homogeneous catalytic particles. In another example of the invention, the catalytic particles are inorganic particles or high temperature resistant plastic particles which are coated with a few angstrom thickness of catalytic metal, thereby forming heterogeneous catalytic particles having a thin catalytic outer surface encapsulating a non-catalytic inner particle. This formulation may be desirable for larger catalytic particles, such as those on the order of 25 u in longest dimension. The heterogeneous catalytic particle of this formulation can comprise an inorganic, organic, or inert filler such as silicon dioxide ($SiO_2$), an inorganic clay such as Kaolin, or a high temperature plastic filler coated on the surface with a catalyst such as palladium adsorbed onto the surface of the filler, such as by vapor deposition or chemical deposition. Only a few atomic layers of catalyst are required for the catalytic particle to have desirable properties conducive to electroless plating.

In one example of forming heterogeneous catalytic particles, a bath of fillers (organic or inorganic) is sorted by size to include particles less than 25 u in size, these sorted inorganic particles are mixed into an aqueous bath in a tank, agitated, and then a palladium salt such as PdCl (or any other catalyst such as a salt of silver of other catalyst) is introduced with an acid such as HCl, and with a reducing agent such as hydrazine hydrate, the mixture thereby reducing metallic Pd which coats the inorganic particles provide a few angstroms of thickness of Pd coated on the filler, thereby creating a heterogeneous catalytic particle which has the catalytic property of a homogeneous Pd particle with a greatly reduced volume requirement of Pd compared to using homogeneous Pd metallic particles. For extremely small catalytic particles on the order of a few nm, however, homogeneous catalytic particles (such as pure Pd) may be preferred.

Example inorganic fillers include clay minerals such as hydrous aluminum phyllosilicates, which may contain variable amounts of iron, magnesium, alkali metals, alkaline earths, and other cations. This family of example inorganic fillers includes silicon dioxide, aluminum silicate, kaolinite ($Al_2Si_2O_5(OH)_4$), polysilicate, or other clay minerals which belong to the kaolin or china clay family. Example organic fillers include PTFE (Teflon) and other polymers with high temperature resistance.

Examples of palladium salts are: $BrPd$, $CL_2Pd$, $Pd(CN)_2$, $I_2Pd$, $Pd(NO_3)_2 \cdot 2H_2O$, $Pd(NO_3)_2$, $PdSO_4$, $Pd(NH_3)\ 4Br_2$, $Pd(NH_3)_4Cl_2H_2O$. The catalytic powder of the present invention may also contain a mixture of heterogeneous catalytic particles (for example, catalytic materials coated over inorganic filler particles), homogeneous catalytic particles (such as elemental palladium), as well as non-catalytic particles (selected from the family of inorganic fillers).

Among the catalysts, palladium is a preferred catalyst because of comparative economy, availability, and mechanical properties, but other catalysts may be used.

FIG. 1A shows a roll of fabric cloth 102 such as woven glass fiber is fed through as set of rollers which guide the fabric into tank 108 which is filled with an epoxy resin blended with catalytic particles and mixed with a volatile liquid to reduce the viscosity, thereby forming an A-stage (liquid) pre-preg.

The resin may be a polyimide resin, a blend of epoxy and cyanide ester (which provides curing at elevated temperatures), or any other suitable resin formulation with selectable viscosity during coating and thermosetting properties after cooling. Fire retardants may be added, for example to comply with a flammability standard, or to be compatible with one of the standard FR series of pre-preg such as FR-4 or FR-10. An additional requirement for high speed electrical circuits is dielectric constant $\varepsilon$ (permittivity), which is often approximately 4 and governs the characteristic impedance of a transmission line formed on the dielectric, and loss tangent $\delta$, which is measure of frequency-dependent energy absorption over a distance, whereby the loss tangent is a measure of how the dielectric interacts with high frequency electric fields to undesirably reduce signal amplitude by a calculable amount of dB per cm of transmission line length. The resin is blended with catalytic particles which have been sorted for size. In one example formulation, the catalytic particles include at least one of: homogeneous catalytic particles (metallic palladium), or heterogeneous catalytic particles (palladium coated over an inorganic particle or high temperature plastic), and for either formulation, the catalytic particles preferably having a maximum extent of less than 25 u and with 50% of the particles by count sized between 12 u and 25 u, or the range 1-25 u, or smaller than 25 u. These are example catalytic particle size embodiments not intended to limit the scope of the invention. In one example embodiment, the catalytic particles (either homogeneous or heterogeneous) are in the size range 1 u-25 u. In another example of the invention, homogeneous catalytic particles are formed by grinding metallic palladium into particles and passing the resultant particles through a sieve with a mesh having 25 u rectangular openings such that all catalytic particles smaller than 25 u are selected, and the grinding operation determines the aspect ratio of the particles in the smallest dimension direction. Aspect ratios less than 2:1 are preferable, but not limited to that range for the present example embodiment, and the catalytic particles may be heterogeneous or homogeneous catalytic particles. In another example, the catalytic resin mixture 106 is formed by blending homogeneous or heterogeneous catalytic particles into the pre-preg resin by a ratio of weights, such as the ratio of substantially 12% catalytic particles by weight to the weight of resin. The ratio by weight of catalytic particles in the resin mixture may alternatively be in the range of 8-16% of catalytic particle weight to the total weight of resin. It is understood that other blending ratios may also be used, and it may be preferable to use smaller particles. In one example of the invention, the catalytic particle density is chosen to provide a mean distance between catalytic particles on the order of 3 u-5 u.

Figure 1B:
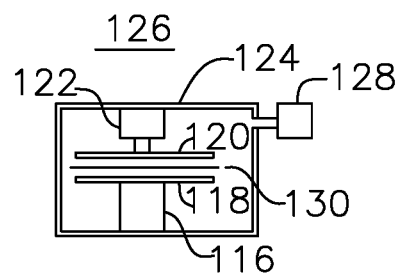
FIG. 1B shows a vacuum lamination press for forming a finished C-stage pre-preg from a raw B-stage pre-preg.

After the fabric is immersed into the catalytic resin bath 106 with rollers 104, the catalytic resin impregnated cloth is guided to rollers 110, which establish the thickness of the uncured liquid A-stage pre-preg 105 which also establishes the percentage of resin in the resin/glass+resin ratio. The A-stage pre-preg 105 is then passed through a baking oven 103 which drives out the organics and other volatile compounds of the A-stage pre-preg and greatly reduces the liquid content, forming tack-free B-stage pre-preg 107 delivered by rollers 111. In an example embodiment, oven 103 dries the volatile compounds from an about 80% solvent ratio of A-stage pre-preg to less than about 0.1% solvent ratio for B-stage pre-preg. The resulting B-stage pre-preg 107 is provided to material handling rollers 111 and can be cut into sheets for ease of handling and storage, and is later placed into the lamination press 126 of FIG. 1B which applies pressure across the surface of the sheets under vacuum, changing the temperature profile while the pre-preg core is in the lamination press, following the temperature plot 202 shown in FIG. 2. In one example of the invention, to create the resin rich surface which excludes catalytic particles to an exclusion depth below the surface, the pre-preg sheets positioned near the outer surfaces (which will later have the surface removed to expose the underlying catalytic particles) are selected to have greater than 65% resin, such as Glass 106 (71% resin), Glass 1067, or Glass 1035 (65% resin), and the inner pre-preg sheets (which are not subject to surface removal) are selected to have less than 65% resin. Additionally, to reduce the likelihood of fiberglass being present near the surface of the catalytic pre-preg, a woven fiberglass may be used with the inner pre-preg layers and a flat unwoven fiberglass may be used in the outer resin rich pre-preg layers. The combination of resin-rich pre-preg and flat unwoven fiberglass on the outer surface layer results in an exclusion zone of 0.7 mil (17 u) to 0.9 mil (23 u) between an outer surface and the encapsulated fiberglass. Glass styles 106, 1035, and 1067 are preferred for use on the outer resin rich surface since the glass fiber thicknesses are smaller (1.3-1.4 mil/33-35 u) than the glass fiber thickness found in typical pre-preg sheets with greater than 65% resin used in the central regions of the laminate, such as glass style 2116, which has 3.7 mil (94 u) fibers. These values are given as examples, the smallest glass fibers which are commercially available are expected to continue to reduce in diameter. The temperature vs. time plot 202 is tailored in the present invention to cause the catalytic particles and fiberglass to migrate away from the outer surface of the laminate, repelled by the surface tension of the epoxy during the liquid state of the gel point temperature. After the cooling cycle of plot 202, the cured C-stage pre-preg sheets are removed from the lamination press. The process which forms the cured C-stage pre-preg sheets may use single or multiple sheets of fiber fabric to vary the finished thickness, which may vary from 2 mil (51 u) to 60 mil (1.5 mm).

Figure 3:
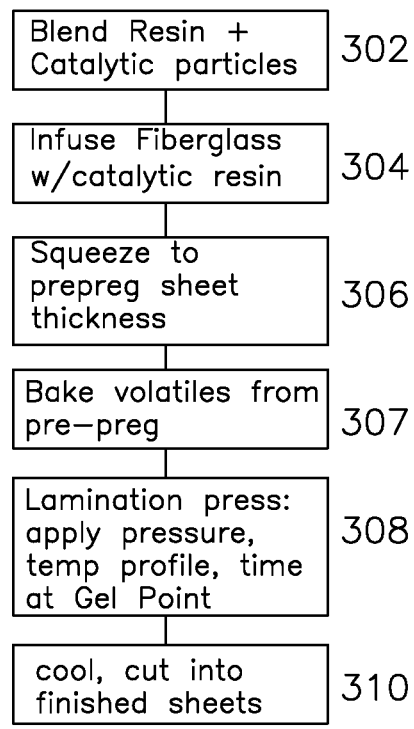
FIG. 3 shows process steps for formation of a catalytic pre-preg.

FIG. 3 shows a flowchart for the process of making pre-preg laminate with catalytic particles infused but excluded from the outer surface of the pre-preg. Step 302 is the blending of catalytic particles into the resin, often with an organic volatile added to lower the mixture viscosity, which forms the catalytic resin 106 placed in reservoir 108. Step 304 is the infusion of catalytic resin into the fabric such as rollers 104 of FIG. 1 may provide to form A-stage pre-preg, and step 306 is the initial rolling of catalytic resin infused fabric into B-stage pre-preg such as by rollers 110, step 307 is a baking step for removing organic solvents to form B-stage pre-preg, and step 308 is the pressing of catalytic resin infused fabric 130 into sheets of catalytic C-stage pre-preg in lamination press 126, which follows the temperature cycle of plot 202, with vacuum pump 128 evacuating chamber 124 throughout the lamination process to remove air bubbles from the epoxy and reduce any air voids that may form in the epoxy. The cooled finished catalytic C-stage pre-preg sheets are cut and stored for later use.

Figure 2:
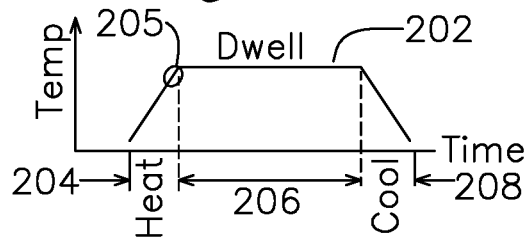
FIG. 2 shows a plot of processing temperature vs. time for a vacuum lamination step of FIG. 1.

The FIG. 2 plot 202 of temperature vs. time shows the temperature profile of the pre-preg in the lamination press 112, which is critical for the formation of a catalytic pre-preg which has surface property of catalytic particles being excluded from the outer resin rich surface, but which are present just below the outer resin rich surface. The resin is in liquid state in reservoir 108, and the pre-preg is in in an A-stage after the resin is impregnated into the fiberglass and passes through rollers 110. The pre-preg is in a B-stage after baking 103 where the volatile organics are baked off accompanied by an initial resin hardening, which converts the B-stage pre-preg into becomes C-stage pre-preg at the end of the lamination cycle, such as the cooling phase of FIG. 2. The B-stage pre-preg is placed into the lamination press and a vacuum is pulled to prevent trapped air from forming between lamination layers. Heat is applied during a temperature ramp-up time 204 to achieve a temperature and pressure determined pre-preg gel point 205 for a duration on the order of 10-15 seconds (the gel point defined as the state where the liquid and solid states are close to equilibrium with each other), which is critical for the process of migrating the catalytic particles away from the surface, after which the temperature of the pre-preg is maintained at the dwell temperature and dwell time 206 which may be in the range of 60-90 minutes, followed by a cooling cycle 208. The dwell temperature and gel point temperature are pressure and resin dependent, in the example range of 120° C. (for epoxy) to 350° C. (for Teflon/polyimide resins). Maintaining the pre-preg at the gel point 205 for too short of a duration will result in the catalytic particles or fiberglass being undesirably present at the surface of the finished pre-preg.

Figure 1C:
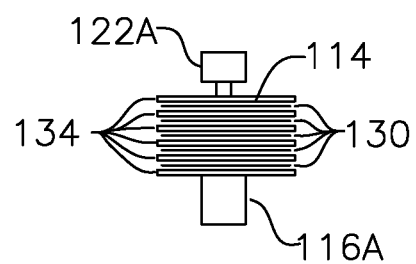
FIG. 1C shows a vacuum lamination stage for forming multiple layers of pre-preg during a lamination.
Figure 4:
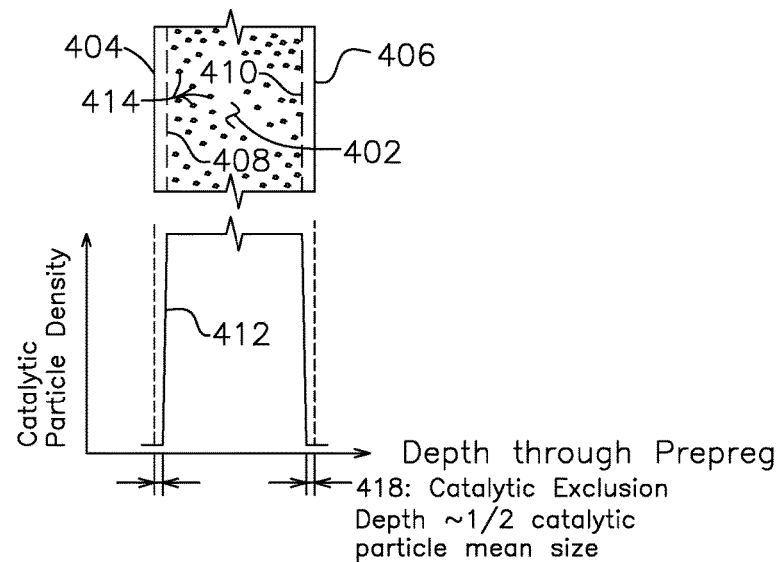
FIG. 4 shows a plot of catalytic particle distribution in a pre-preg material with respect to a section view of the pre-preg material.

FIG. 4 shows the resultant catalytic pre-preg 402 formed by the process of FIGS. 1, 2, and 3, where the catalytic particles 414 are distributed uniformly within the central region of pre-preg 402, but are not present below a boundary region 408 below first surface 404, or below boundary region 410 below second surface 406. For the example particle distribution of particles smaller than 25 u, the catalytic particle boundary is typically 10-12 u below the surface (on the order of half of the particle size), accordingly this depth or greater of surface material must be removed for the embedded catalytic particles to be available for electroless plating.

Prior art catalytic laminates have activated surfaces that must be masked to prevent unwanted electroless plating on the activated surface of the catalytic laminate. By contrast, the catalytic laminate of the present invention excludes catalytic particles over the thickness extent from first surface 404 to first boundary 408, and from second surface 406 to second boundary 410, providing the benefit that a separate mask layer preventing contact with the catalytic particles is not required for electroless plating as it is in the prior art. Accordingly, removal of surface material from either first surface 404 through the exclusion depth to the depth of boundary layer 408 or deeper, or removal of surface material from second surface 406 through the exclusion depth to second boundary 410, results in the exposure of catalytic material which may be used for electroless plating. It is also desirable for the process which provides the resin rich surface to also exclude not only catalyst, but the fiber fabric, as removal of the surface layer in subsequent steps which results in the exposure of fibers requires additional cleaning steps, accordingly it is preferred that the surface removal be of resin only, so as to expose the underlying catalytic particles. This is accomplished by using a combination of resin-rich outer pre-preg layers and flat unwoven fiberglass layers having smaller diameter fibers on the outside layers.

Figure 5A:
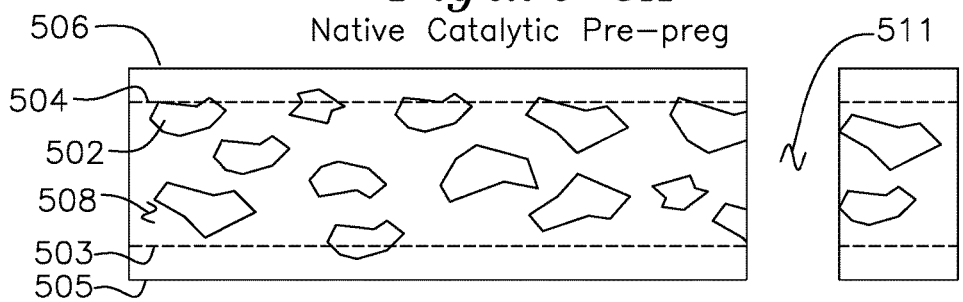
FIG. 5A shows a section view of native catalytic pre-preg.

The sequence of FIGS. 5A to 5D show the process steps, identifying various structures, but are not to scale, and provide only a simplified view of the process steps for understanding the invention. FIG. 5A shows a magnified cross section view of catalytic pre-preg 508 formed by the process of FIGS. 1, 2, and 3. Catalytic particles 502 may be in the size range of 25 u and smaller, in the present example they are shown in the range 12 u to 25 u for clarity. The catalytic particles may include heterogeneous catalytic particles (organic or inorganic particles having a catalytic surface coating) or homogeneous particles (catalytic metal particles), as described previously. The first boundary 504 is substantially 25 u below the first surface 506. The second surface 505 and second surface boundary 503 on the opposite surface are shown for reference, but may be formed in the same manner as described for the sequence of FIGS. 5A to 5E. A drilled hole 511 which will provide connectivity between traces on the first layer 506 and traces on the second layer 505 is also shown.

Figure 5B:
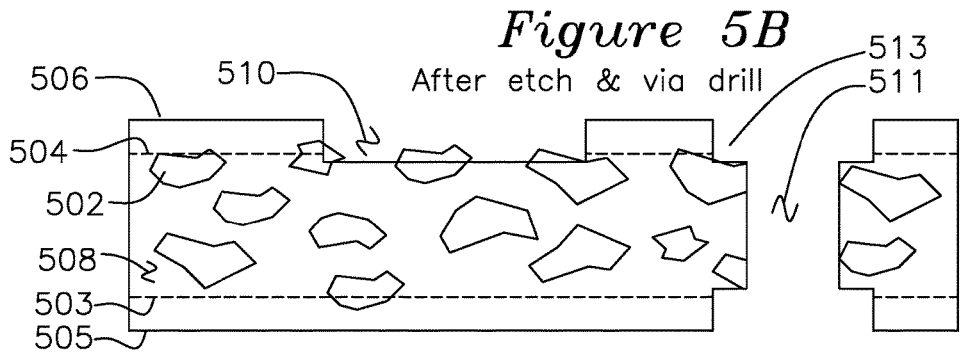
FIG. 5B shows a section view of catalytic pre-preg after a surface removal step.

FIG. 5B shows the laminate of FIG. 5A with a channel 510 formed by removal of the surface layer 506 in a region where a trace is desired. Pre-preg is also removed in an annular ring 513 of surrounding the via, at the same or different depth as the trace channel 510. The removal of surface material may be by laser ablation, where the temperature of the catalytic pre-preg is instantly elevated until the catalytic pre-preg is vaporized, while leaving the surrounding pre-preg structurally unchanged, leaving the catalytic particles exposed. It may be preferable to use a laser with a wavelength with a low reflectivity and high absorption of this optical wavelength for the pre-preg material being ablated, such as ultraviolet (UV) wavelengths. Examples of such UV lasers are the UV excimer laser or yttrium-aluminum-garnet (YAG) laser, which are also good choices because of the narrow beam diameter and high available power which for forming channels of precise mechanical depth and with well-defined sidewalls. An example laser may remove material in a 0.9-1.1 mil (23 u to 28 u) diameter width with a depth governed by laser power and speed of movement across the surface. Another surface removal technique for forming channel 510 and annular ring 513 is plasma etching, which may be done locally or by preparing the surface with a patterned mask which excludes the plasma from the surface layers 506 or 505, such as a dry film photoresist or other mask material which has a low plasma or chemical etch rate compared to the plasma or chemical etch rate of catalytic pre-preg. The photoresist thickness is typically chosen based on epoxy/photoresist etch selectivity (such that plasma etch to the desired depth of removal of the cured epoxy leaves sufficient photoresist at the end of the etch), or in the case of photoresist which is used as an electroplate mask, the thickness is chosen according to desired deposition thickness. Typical dry film thickness is in the range of 0.8-2.5 mil (20-64 u). Plasmas suitable for etching the resin rich surface include mixtures of oxygen (O) and $CF_4$ plasmas, mixed with inert gasses such as nitrogen (N), or argon (Ar) may be added as carrier gasses for the reactive gases. A mask pattern may also be formed with a dry film mask, metal mask, or any other type of mask having apertures. Where a mechanical mask is used, the etch resist may be applied using any of photolithography, screen printing, stenciling, squeegee, or any method of application of etch resist. Another method for removal of the surface layer of pre-preg is mechanical grinding, such as a linear or rotational cutting tool. In this example, the pre-preg may be secured in a vacuum plate chuck, and a rotating cutter (or fixed cutter with movable vacuum plate) may travel a pattern defining the traces such as defined by x,y coordinate pairs of a Gerber format photofile. In another example of removing surface material, a water cutting tool may be used, where a water jet with abrasive particles entrained in the stream may impinge on the surface, thereby removing material below the first boundary 504. Any of these methods may be used separately or in combination to remove surface material and form channel 510 from pre-preg 508, preferably with the channel extending below the first boundary 504. Accordingly, the minimum channel depth is the depth required to expose the underlying catalytic particles, which is a characteristic of the cured pre-preg. As the catalytic material is dispersed uniformly through the cured pre-preg below the exclusion boundary 504, the maximum channel depth is limited by the depth of the woven fiber (such as fiberglass) fabric, which tends to complicate channel cleaning, as the fibers may break off and re-deposit in channels intended for electroless plating, or otherwise interfere with subsequent process steps. Typical channel depths are 1 mil (25 u) to 2 mil (70 u), below the exclusion depth of the c-stage pre-preg. The final step after removing the surface material to form the channel 510 is to clean away any particles of material which were removed, which may be accomplished using ultrasound cleaning, jets of water mixed with surfactant, or any other cleaning means which does not result in surface 506 material surrounding the channel from being removed.

FIG. 5C shows contour plots for progress of electroless plating over time, where the catalytic pre-preg of FIG. 5B is placed into an electroless bath using a dissolved reducing agent to reduce the metal ions to the metallic state on the catalytic pre-preg. One example electroless copper bath formulation uses a mixture of Rochelle salt as the complexing agent, copper sulfate as the copper metal source, formaldehyde as the reducing agent, and sodium hydroxide as a reactant. In this example, the tartrate (Rochelle salt) bath is preferred for ease of waste treatment; the Rochelle salt does not chelate as strongly as alternatives such as EDTA or quadrol. In this example, the tartrate (Rochelle salt) is the completing agent, copper sulfate is the metal source, formaldehyde is the reducing agent, and sodium hydroxide is a reactant. Other electroless plating formulations are possible, this example is given for reference. The electroless plating initially forms over the surfaces of the exposed catalytic particles, as shown in the hatch pattern 520 at time t1 and the matching hatch patterns in via 535. The copper deposition progresses as the electroless plating continues to the hashed regions of deposition shown for subsequent times t2 522, t3 524, and t4 526, at which time the deposition 526 may extend above the surface 506 and the via 535 is also filled with copper.

A key advantage of electroless plating with channels etched in catalytic material is that the electroless plating progresses on all three sides at once, compared to electroplating which only progresses from the electrically conductive bottom (initially plated) layer.

FIG. 5D shows the result of a surface smoothing operation, where the finished electroless plated trace 534 and via 535 are co-planar with surface 532. Surface smoothing may be accomplished many different ways, for example using a 420 to 1200 grit abrasive applied on a planar surface with mild pressure and linear or rotational agitation between the board and planar surface to provide a grinding operation. Other methods for planarizing the surface may be used, including milling or machining using chemical processes, mechanical processes, or other methods for forming a planar surface. An advantage of an additive process of the present invention is that for traces formed using a prior art process which etches all of the copper except the desired trace copper, surface contaminates on the surface cause adjacent trace shorting, as a copper bridge remains where the contamination was present on the surface of the copper, which does not occur in additive electroless plating of the present invention. As seen in FIG. 5D, trace 534 is supported on three sides, and is locked into its associated channel in the catalytic pre-preg 508.

Figure 6A:
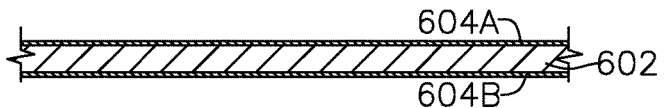
FIGS. 6A through 6I show the process steps for forming a sub having top and bottom traces on a non-catalytic laminate.
Figure 6B:
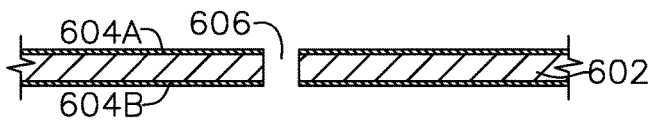
Figure 6C:
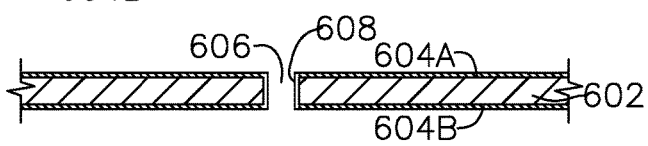

FIGS. 6A through 6I show a cross section view of the process steps for formation of a sub layer 620 using an etching (subtractive) process. FIG. 6A shows a dielectric 602 with top layer copper clad 604A and optional bottom layer copper clad 604B. The dielectric 602 may be any material suitable for lamination, including a conventional C-stage pre-preg material as was previously described. FIG. 6B shows hole 606 drilled through the C-stage pre-preg 602 and copper foil 604A, 604B. A desmearing process follows in FIG. 6C, where the drilled vias and through holes, which may have copper and dielectric smeared inside the apertures are cleared and prepared for a subsequent electroless plating step. A typical desmearing process of FIG. 6C includes a permanganate treatment to remove residues through vigorous oxidation, a neutralizer treatment which neutralizes the permanganate, the application of a surface catalyzer such as palladium for enabling electroless copper plating, and an electroless plating step whereby the via and through hole surfaces are coated 608 with copper for connectivity of the top copper foil 604A to bottom copper foil 604B.

Figure 6D:
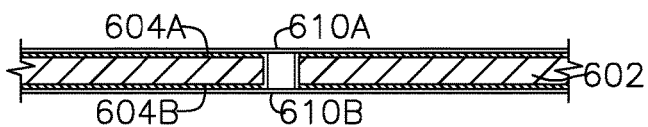
Figure 6E:
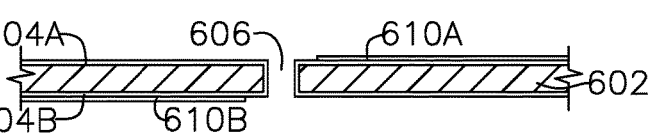
Figure 6F:
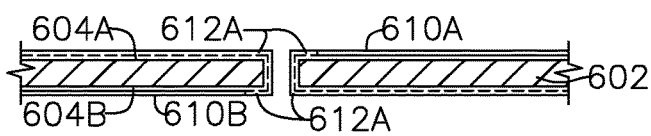
Figure 6G:
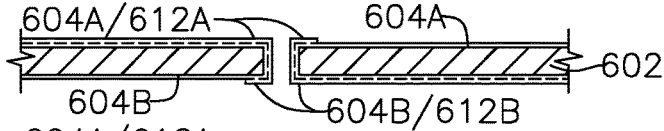
Figure 6H:
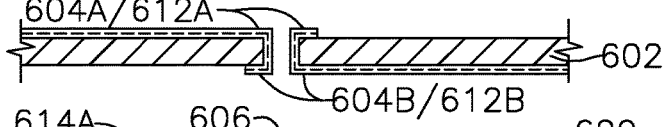
Figure 6I:
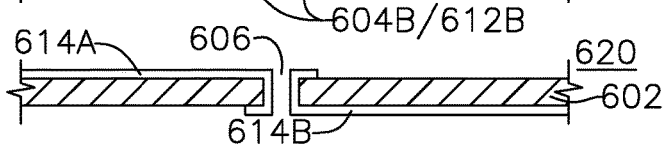

FIG. 6D shows the application of photoresist such as dry film or a liquid photoresist 610A and 610B to the top and bottom surfaces, respectively. FIG. 6E shows the sub after photoresist 610A and 610B exposure using a negative optical image which polymerizes the photoresist in the regions which will not receive copper through the electroplating step of FIG. 6F, where the interconnected top and bottom copper surfaces 604A, 604B and via deposition copper 608 form a single electrode for electroplating, whereby a potential is applied across the single electrode formed by the sub and a sacrificial copper electrode present in the plating bath, such that the copper is drawn from the sacrificial copper electrode and into the ionic solution, electroplating onto the exposed copper regions of the sub as shown in regions 612A, but not onto the areas coated with polymerized resist 610A and 610B. After the electroplating has built the copper layer to a satisfactory overall thickness, tin plating 612A/612B is applied onto the exposed surfaces of the electroplated regions 612, and the tin plating 612A/612B is used as an etch resist after the photoresist 610A/610B is stripped in step 6G, leaving the tin-plated copper 604A/612A, 604B/612B, and exposed copper 604A/604B. The exposed copper 604A/604B is etched away in step 6H, leaving only the tin-plated copper regions 604A/612A and 604B/612B. After a tin etch step shown in FIG. 6I, the tin is removed leaving only copper traces 614A/614B and plated through via 606, and the finished sub 620 is ready for a subsequent lamination step.

Figure 7A:
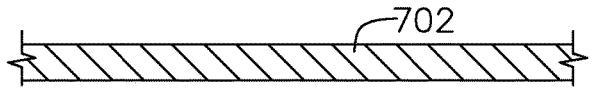
FIG. 7A through 7D show the process steps for forming a sub having top and bottom traces on a catalytic laminate.
Figure 7B:
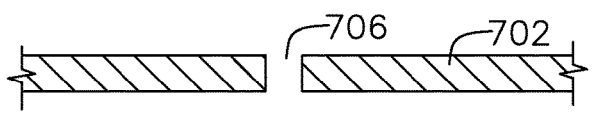
Figure 7C:
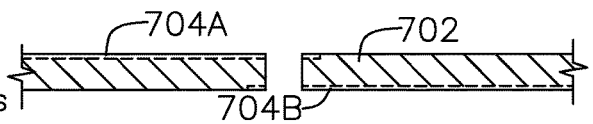

FIGS. 7A through 7D show cross section views of an improved catalytic layer preparation for forming a sub layer, using the catalytic laminate process previously described in FIGS. 5A through 5D and with the catalytic particle distribution shown in the cross section view of FIG. 4. FIG. 7A shows a catalytic laminate 702 as described earlier, having catalytic particles dispersed through the C-stage pre-preg 702 where the catalytic laminate is formed having a surface catalytic particle exclusion depth such that the characteristic of the material is as was described in FIG. 4, having a surface region which has few catalytic particles from a surface region to a catalytic particle exclusion depth, below which exclusion depth catalytic particles are sufficiently abundant to enable electroless plating to occur in regions where a channel is formed which has a depth equal to or greater than the exclusion depth. Accordingly, the surface regions have a catalytic particle density which is insufficient to support electroless plating. FIG. 7B shows a process step where vias 706 are formed using punching, drilling, laser cutting, water cutting, or any other means for forming an aperture or via 706. FIG. 7C shows channels 704A and 704B formed using any of the methods previously described, with the channels formed below the exclusion depth of catalytic particles to enable electroless plating.

Figure 7D:
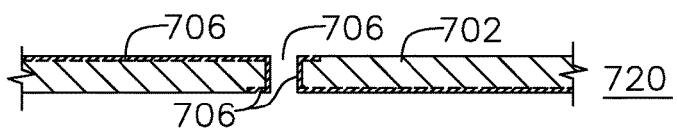

FIG. 7D shows a section view after electroless plating, where copper 706 is electroless plated in channels 704A, 704B where catalytic particles are exposed, as well as in the drilled via 706 which also exposes the catalytic particles, as was previously described. At the completion of the process at FIG. 7D, the catalytic laminate sub 720 may be used in subsequent lamination steps.

Figure 8A:
FIG. 8A through 8D show the process steps for forming an interposer layer.
Figure 8B:
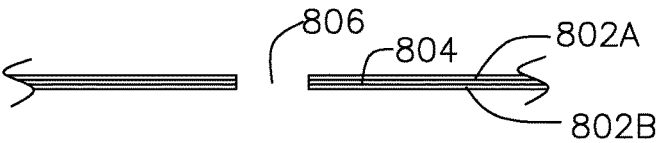
Figure 8C:
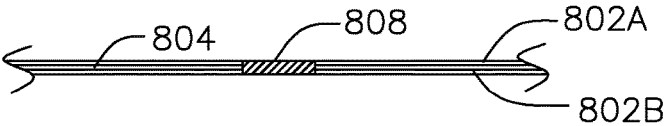
Figure 8D:
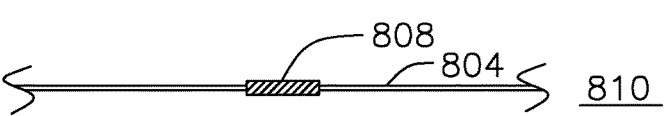

FIGS. 8A to 8D show cross section views of the process steps for forming the interposer connectivity layer 810. A core layer of material suitable for lamination 804 has a top surface and bottom surface with release films 802A and 802B applied. The thickness and composition of lamination 804 may be any material which exhibits satisfactory adhesion to adjacent layers after lamination, and has stable properties at the lamination temperatures and pressures of the process. Exemplar materials are any of the B-stage pre-preg materials, polyimides, polymerized materials, polyimide, B-level pre-preg, epoxy or epoxy blends for flexible or non-flexible dielectrics, cyanate ester, Polytetrafluoroethylene (PTFE, known by the trade name Teflon®) or PTFE blend prepregs or adhesives, bond plies such as sequential layers of adhesive, polyimide, adhesive, or other core materials used for multi-layer PCB fabrication. FIG. 8B shows the formation of a connectivity aperture 806, after which FIG. 8C shows the lamination 804 and films 802A/802B placed on a planar surface with a small amount of conductive paste 808 applied such as with a squeegee pulled over the surface of the top release film 802A, after which the conductive paste may be allowed to dry for handling stability. The release films 802A/802B are removed in FIG. 8D, leaving an interposer 810 which comprises an insulating dielectric 804 and apertures with dried conductive paste 808.

Each sub layer 620/720 has a surface which will be positioned adjacent to a corresponding surface of an interposer layer 810, with alternating sub layers 620/720 and interposer layers 810, the outer layers being sub layers 620/720. Each sub layer has one or more interconnections in the form of a via or a pad for connection from one sub layer to another through the interposer layer 810, and at each connection via or pad from one sub layer to another through the interposer layer 810, an aperture containing conductive paste 808 is placed.

Figure 9A:
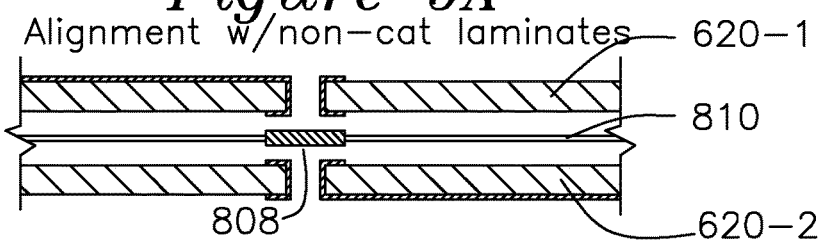
FIG. 9A through 9C show the steps for forming multi-layer circuit board with interconnected layers in a single lamination step.
Figure 9B:
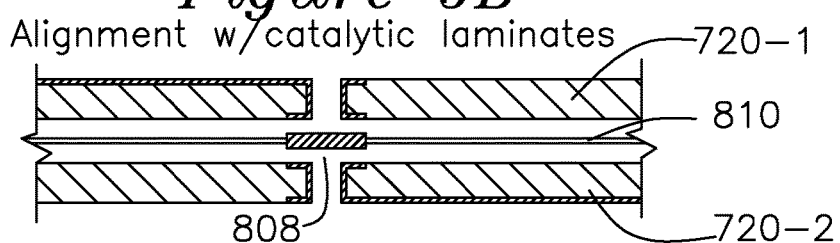

FIG. 9A shows a cross section view of a pre-lamination configuration and alignment for non-catalytic sub layers 620-1 and 620-2 formed with the process of FIGS. 6A to 6I with interposer layer 810 formed using the process of FIGS. 8A-8D. FIG. 9B shows a cross section view of the same stack-up as FIG. 9A but for a pre-lamination stack using catalytic sub layers 720-1 and 720-2 formed using the process of FIGS. 8A to 8D, with interposer layer 810 positioned between the sub layers and with an aperture and conductive paste positioned centered next to an adjacent sub via or pad.

Figure 9C:
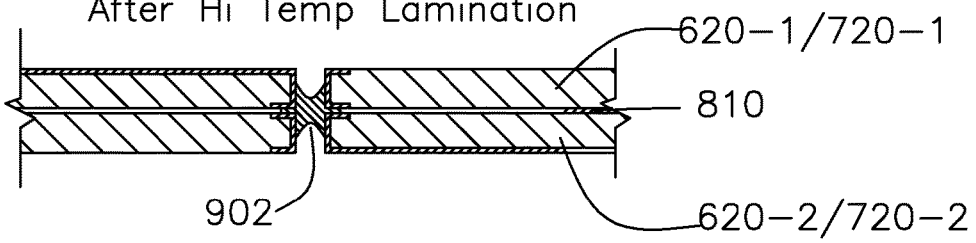

FIG. 9C shows the final result after application of elevated lamination temperature and lamination pressure. Sub layers 620A-1/720A-1, interposer layer 810, and sub layers 620-2/720-2 are mechanically laminated into a multi-layer circuit board, where the conductive paste 808 consolidates into a monolithic conductor and wicks into the adjacent sub layer vias or pads to form the conductive bridge 902. For this combined lamination and consolidation of the conductive paste into a single conductor 902, the process temperature of the lamination, the composition of the conductive paste 808, and mechanical aspects of the vias of the subs 620/720 must be selected for mutual compatibility. In one example of the invention, the sub vias are approximately 2 mil inner diameter (before plating), approximately 1 mil inner diameter (after plating), and the interposer aperture diameter is 2 mil, with a release film thickness of approximately 1 mil on each side (thereby forming an approximately 3 mil thick barrel of conductive paste 808 with an exemplar 2 mil diameter in FIG. 8D). The conductive paste may be any conductive paste known in the prior art, such as an emulsion of electrically conductive particles with an average size on the order of 10 u, where the conductive particles include at least one of copper, silver, gold, palladium, nickel, indium, bismuth, tin, or lead, optionally combined in ratios to form a eutectic system with a preferentially low single melting temperature, or the particles may be formed from copper coated with gold, silver, or nickel, the particles of either type mixed with a binder such as phenolic plastic, novolac epoxy resin (a pre-polymerized resin which cures upon application of heat), or other resin mixed with a solvent such as any of: diethylene glycoldibutyl ether, poly(formaldehyde/phenol) 2,3 epoxy propyl ether, or ethyl sorbitol acetate, each of which provides a quick drying time to enable the removal of the release film of FIG. 8D. Alternatively, the conductive particles may be mixed with a binder such as aliphatic acid or stearic acid and a solvent such as alcohol or acetone. An example commercially available conductive powder is GB05K (5.5 um average particle size) or GB10K (10 u average particle size) silver-plated copper powder manufactured by Hitachi Chemical Co., with aspect ratio of approximately 1.0. It is preferred that the conductive paste 808 conductive metal particles be on the order of 1 mil or smaller. In a preferred embodiment, the metal particles have a maximum length which is less than ¼th of the diameter of the interposer aperture or sub via aperture after plating.

Figure 10A:
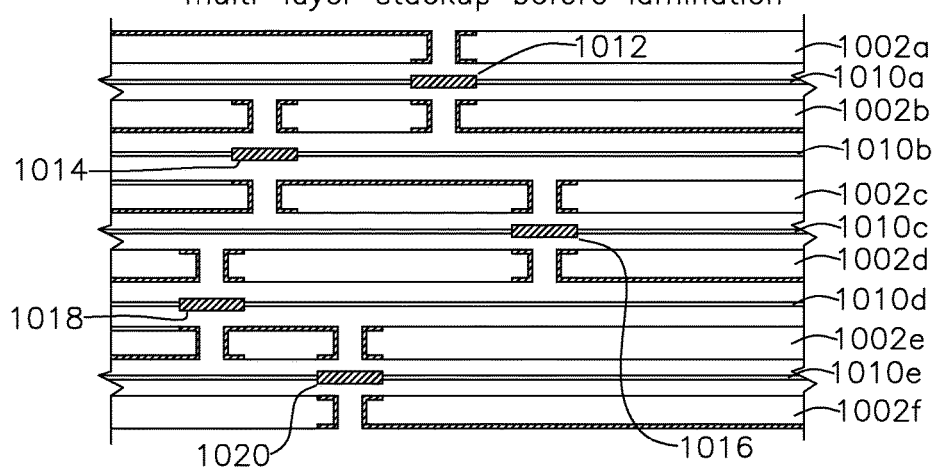
FIG. 10A shows a multi-sub stack-up for forming a multi-layer circuit board.

Figure 10A shows an example pre-lamination stack with layer pairs comprising alternating sub layers 1002a, 1002b, 1002c, 1002d, 1002e, and 1002f and interposer layers 1010a, 1010b, 1010c, 1010d, and 1010e. Interposer layers 1010a, 1010b, 1010c, 1010d, and 1010e have apertures filled with conductive solder paste 1012, 1014, 1016, 1018, and 1020, as before and which are prepared as was described for FIGS. 8A, 8B, 8C, and 8D. Interposer layers without an aperture or functional connection across adjacent subs may optionally be replaced with C-stage pre-preg for lamination.

Figure 10B:
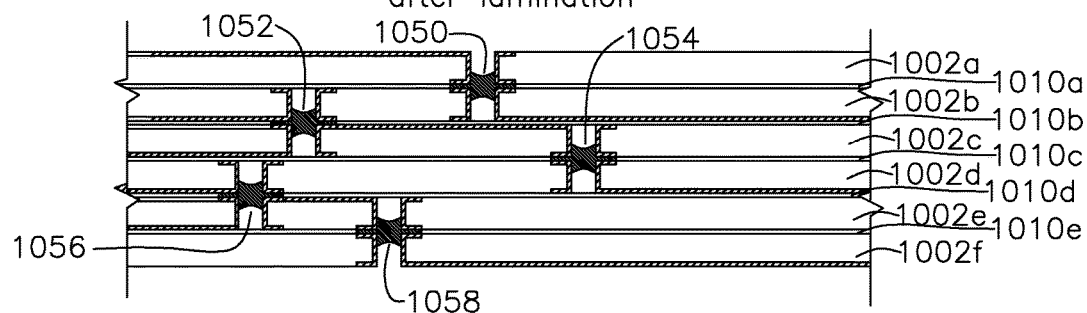
FIG. 10B shows the completed lamination of FIG. 10A in a single lamination step.

FIG. 10B shows the stack-up of FIG. 10A after lamination and consolidation where the FIG. 10A conductive paste 1012, 1014, 1016, 1018, and 1020 has melted and reflowed as shown in respective regions 1050, 1052, 1054, 1056, and 1058, and the adjacent interposer and subs are laminated together during the same interval and process.

In the present specification, "approximately" is understood to mean less than a factor of 4 greater or smaller, "substantially" is understood to mean less than a factor of 2 greater or smaller. "Order of magnitude" of a value includes the range from 0.1 time the values to 10 times the value. A "mil" is understood to be 0.001 inch.

Certain post-processing operations are not shown which are generic to printed circuit board manufacturing, and may be performed using prior art methods on boards produced according to the novel process. Such operations include tin plating for improved solder flow, gold flash for improved conductivity and reduced corrosion, soldermask operations, silkscreening information on the board (part number, reference designators, etc.), scoring the finished board or providing breakaway tabs, etc. Certain of these operations may produce improved results when performed on planarized boards of certain aspect of the present invention. For example, silkscreened lettering over traces or vias traditionally breaks up because of trace and via thickness causing surface discontinuities over the board surface, whereas these operations would provide superior results on a planarized surface.

We claim:

1. A multi-layer circuit board formed from a top sub, and one or more composite layers, each composite layer comprising an interposer layer and a sub layer;
    said top sub and each said sub layer having at least one interconnection to a sub layer which is opposite an intervening interposer layer;
    said interposer layer having an aperture positioned at each said interconnection between associated said sub layers;
    said sub layers having a plated via or a pad at each said interconnection;
    each said interconnection having a solid metallic connection;
    at least one of the top sub or the sub layer having a surface, the surface having channels formed in the surface, the channels containing traces below the surface, the channels having catalytic particles exposed below the surface.

2. The multi-layer circuit board of claim 1 where at least one of said top sub or one of said sub layer is a catalytic laminate with traces formed on at least one surface using an electroless plating process.

3. The multi-layer circuit board of claim 2 where said traces are formed in channels which have a depth of at least a catalytic particle exclusion depth.

4. The multi-layer circuit board of claim 1 where said traces are formed above a non-catalytic laminate.

5. The multi-layer circuit board of claim 1 where said interposer is formed from at least one of: polyimide, B-stage pre-preg, epoxy or epoxy blends for flexible or non-flexible dielectrics, cyanate ester, Polytetrafluoroethylene (PTFE) or PTFE blend prepreg or adhesives, or bond plies including sequential layers of adhesive, polyimide, and adhesive.

6. The multi-layer circuit board of claim 1 where said solid metallic connection contains at least one of: copper, silver, gold, palladium, nickel, indium, bismuth, tin, or lead.

7. The multi-layer circuit board of claim 1 where said solid metallic connection contains a binder for conductive particles which includes at least one of: phenolic plastic, a resin, or novolac epoxy resin.

8. The multi-layer circuit board of claim 1 where at least one of said top sub or a sub of said composite layer includes a via having an inner diameter on the order of 1 mil after plating.

9. The multi-layer circuit board of claim 1 where at least one of said interposers has an aperture on the order of 1 mil diameter.

10. A multi-layer circuit board comprising:
a top sub comprising a dielectric layer having electrically conductive traces formed on a surface;
one or more composite layers, each composite layer comprising:
 a sub layer formed from a dielectric layer having electrically conductive traces formed on a surface, the electrically conductive traces having at least one region of interconnection;
 an interposer layer having at least one aperture located at said at least one region of interconnection;
said top sub and each said sub layer having at least one interconnection to a sub layer which is opposite an intervening interposer layer;
said sub layers having a plated via or a pad at each said interconnection;
each said interconnection comprising a solid metallic connection formed from melting a metallic paste,
at least one sub layer having traces formed in channels and below a surface of the sub layer, the inner surfaces of the channels having exposed particles of catalytic material for electroplating a metal trace formed in the channel.

11. The multi-layer circuit board of claim 10 where said melted metallic paste is formed by an elevated temperature lamination which laminates the interposer layer to at least one of a top sub or a composite layer.

12. The multi-layer circuit board of claim 10 where at least one of said top sub or said sub layer has electrically conductive traces formed by electroless plating.

13. The multi-layer circuit board of claim 10 where at least one of said top sub or said sub layer has electrically conductive traces in channels below a surface layer.

14. The multi-layer circuit board of claim 13 where the traces are in contact with catalytic particles in the channel.

15. The multi-layer circuit board of claim 10 where the electrically conductive traces are formed by patterned copper foil bonded to a non-catalytic laminate.

16. The multi-layer circuit board of claim 10 where the conductive paste contains at least one of: copper, silver, gold, palladium, nickel, indium, bismuth, tin, or lead.

17. The multi-layer circuit board of claim 10 where the conductive paste contains a binder for conductive particles which includes at least one of: phenolic plastic, a resin, or novolac epoxy resin.

18. The multi-layer circuit board of claim 10 where the interposer is formed from at least one of: polyimide, B-stage pre-preg, epoxy or epoxy blends for flexible or non-flexible dielectrics, cyanate ester, Polytetrafluoroethylene (PTFE) or PTFE blend prepreg or adhesives, or bond plies comprising sequential layers of adhesive, polyimide, and adhesive.

* * * * *